United States Patent
Jeong et al.

(10) Patent No.: US 9,192,048 B1
(45) Date of Patent: Nov. 17, 2015

(54) BONDING PAD FOR PRINTED CIRCUIT BOARD AND SEMICONDUCTOR CHIP PACKAGE USING SAME

(71) Applicant: Avago Technologies General IP (Singapore) Pte. Ltd., Singapore (SG)

(72) Inventors: Jin Jeong, Kyunggi province (KR); Chris Chung, Seoul (KR); Deog Soon Choi, Seoul (KR); Young Ho Lee, Seoul (KR); Yong-Ik Choi, Kyoung Ki-Do (KR)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/310,075

(22) Filed: Jun. 20, 2014

(51) Int. Cl.
| | |
|---|---|
| *H01L 23/48* | (2006.01) |
| *H05K 1/18* | (2006.01) |
| *H01L 23/00* | (2006.01) |
| *H05K 1/09* | (2006.01) |
| *H05K 1/11* | (2006.01) |

(52) U.S. Cl.
CPC ............... *H05K 1/181* (2013.01); *H01L 24/06* (2013.01); *H01L 24/17* (2013.01); *H01L 24/49* (2013.01); *H05K 1/092* (2013.01); *H05K 1/111* (2013.01); *H01L 2224/05147* (2013.01); *H01L 2224/16227* (2013.01); *H01L 2224/48106* (2013.01); *H01L 2224/48227* (2013.01)

(58) Field of Classification Search
CPC ................... H01L 24/06; H01L 24/49; H01L 2224/05147; H05K 1/092; H05K 1/111; H05K 1/181
USPC ................................................... 257/759, 762
See application file for complete search history.

(56) References Cited

U.S. PATENT DOCUMENTS

| | | | | |
|---|---|---|---|---|
| 6,392,297 | B2 * | 5/2002 | Seto ............................... | 257/701 |
| 7,413,978 | B2 * | 8/2008 | Tanaka ........................... | 438/667 |
| 8,674,507 | B2 | 3/2014 | Chou et al. | |
| 2005/0014355 | A1 * | 1/2005 | Chan et al. .................... | 438/613 |
| 2006/0060970 | A1 * | 3/2006 | Jeong et al. ................... | 257/750 |
| 2008/0128911 | A1 * | 6/2008 | Koyama ......................... | 257/759 |
| 2008/0230914 | A1 * | 9/2008 | Sakamoto et al. ............. | 257/762 |
| 2009/0206486 | A1 * | 8/2009 | Lin ................................. | 257/759 |
| 2011/0037174 | A1 * | 2/2011 | Nikaido et al. ................ | 257/737 |
| 2014/0002188 | A1 | 1/2014 | Chen et al. | |
| 2014/0313682 | A1 * | 10/2014 | Mitome ......................... | 361/767 |

OTHER PUBLICATIONS

"Insights from the Leading Edge", Monthly Archives: Jul. 2010.

* cited by examiner

*Primary Examiner* — Alan R Wilson (57) ABSTRACT

A bonding pad for use in attaching a semiconductor chip to a printed circuit board, includes: a copper layer; an organic layer disposed over the copper layer in a pattern such that part of the copper layer is exposed; and a gold layer disposed over the organic layer and in contact with the exposed part of the copper layer.

32 Claims, 7 Drawing Sheets

BONDING PAD FOR PRINTED CIRCUIT BOARD AND SEMICONDUCTOR CHIP PACKAGE USING SAME

BACKGROUND

A semiconductor chip may be electrically connected to a bonding pad formed on a printed circuit board through a wire.

Figure 1:
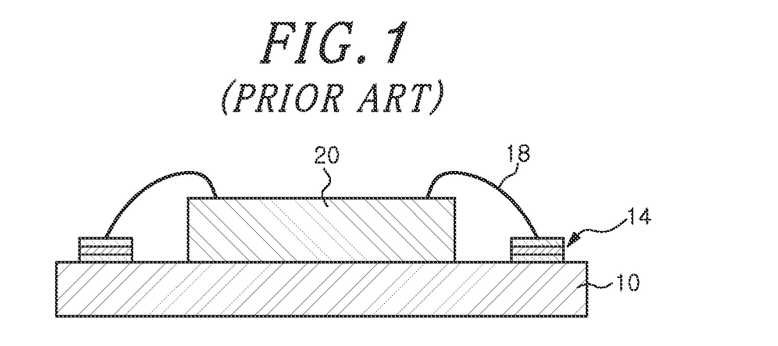
FIG. 1 is a cross-sectional view showing a known semiconductor chip attached to a printed circuit board.

FIG. 1 is a cross-sectional view showing a known semiconductor chip 20 attached to a printed circuit board 10.

Referring to FIG. 1, the semiconductor chip 20 is connected to the printed circuit board 10 by a wire 18. The wire 18 is bonded to a bonding pad 14 formed on the printed circuit board 10. The bonding pad 14 is electrically connected with a wiring (not shown) formed on the printed circuit board 10. Although gold is preferably used as a material for the bonding pad 14, a copper layer plated with gold has been used for reducing the manufacturing cost. However, when copper is in direct contact with gold, copper may diffuse into the gold, thereby weakening the adhesivity between the wire 18 and the bonding pad 14 or causing galvanic corrosion.

Figure 2:
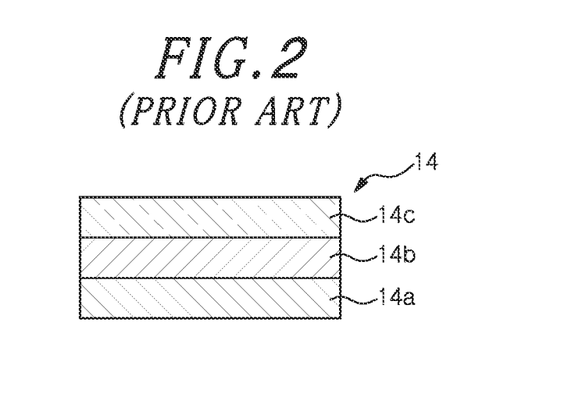
FIG. 2 is an enlarged sectional view of the bonding pad of FIG. 1.

One known method to attempt to avoid copper diffusion into gold is described in connection with FIG. 2, which is an enlarged sectional view of the bonding pad 14 of FIG. 1. In the bonding pad 14, a nickel layer 14b serving as a diffusion barrier film—is formed between a copper layer 14a and a gold layer 14c to prevent the direct contact between them. While the nickel layer 14b provides a reduction in copper diffusion, the additional cost incurred through the use of nickel makes this approach undesirable.

What is needed, therefore, is a bonding structure that overcomes at least the shortcomings described above.

BRIEF DESCRIPTION OF THE DRAWINGS

The described embodiments are best understood from the following detailed description when read with the accompanying drawing figures. It is emphasized that the various features are not necessarily drawn to scale. In fact, she dimensions may be arbitrarily increased or decreased for clarity of discussion. Wherever applicable and practical, like reference numerals refer to like elements.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" or "about" means to within an acceptable limit or amount to one having ordinary skill in the art. For example, "approximately the same" means that one of ordinary skill in the art would consider the items being compared to be the same.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

As used herein, it will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Generally, the present teachings relate to a bonding pad including a diffusion barrier film, which does not comprise nickel. The diffusion barrier film is disoosed between a copper layer and a gold layer. In certain representative embodiments, the bonding pad is provided in a semiconductor structure, such as a semiconductor chip package.

Another aspect of the present invention is to provide a semiconductor chip package including the bonding pad.

In accordance with a representative embodiment, there is provided a bonding pad for use in attaching a semiconductor chip to a printed circuit board, which includes a multilayer structure. The multilayer structure includes a copper layer; an organic layer disposed on the copper layer in a pattern such that part of the copper layer is exposed; and a gold layer disposed on the organic layer and in contact with the exposed part of the copper layer.

Figure 3:
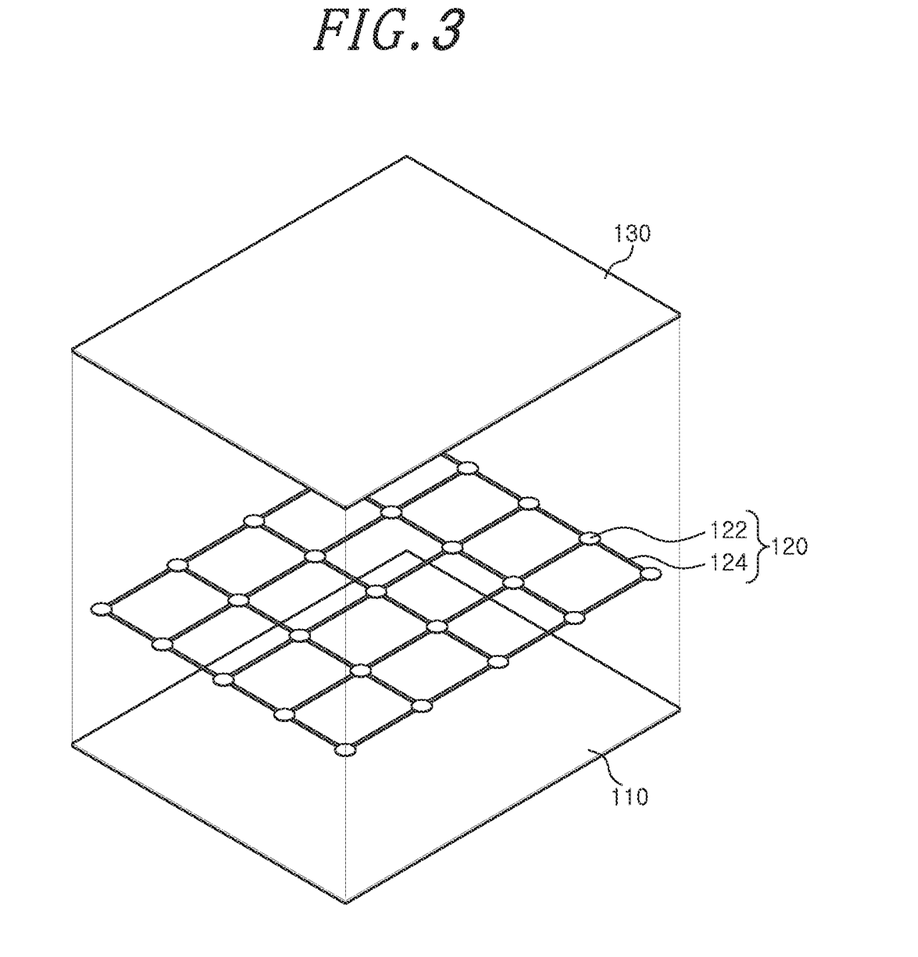
FIG. 3 is an exploded perspective view showing a bonding pad in accordance with a representative embodiment.

FIG. 3 is an exploded perspective view showing a bonding pad according to representative embodiment.

The bonding pad 100 comprises a multilayer structure. The multilayer structure comprises a copper layer 110, an organic layer 120, and a gold layer 130. The organic layer 120 is disposed over the copper layer 110. For example, the organic layer 120 may include imidazole ($C_3H_4N$). As is known to one of ordinary skill in the art, imidazole is an organic fiber material, and is particularly useful in the various embodiments, and especially in applications that include a known printed circuit board (PCB).

In a representative embodiment, the organic layer 120 is partially formed using a known technique over the copper layer 110 such that a part of the copper layer 110 is not completely covered by the organic layer 120. For example, the organic layer 120 may be formed in a reticular structure. Furthermore, the organic layer 120 may be formed by intersecting a plurality of lines 124 of the organic layer (often referred to as organic lines 124). Each of the portions at each of which organic lines 124 intersects each other is referred to as "an embossment 122". In other words, the organic layer includes the organic lines 124 and the embossments 122. The representative embodiment depicted in FIG. 3 depicts the reticular structure comprising the organic lines 124 disposed parallel with the intersection of the organic lines 124 being substantially orthogonal so as to form "rectangles" with "corners" at the embossments 122. This is merely illustrative, and other structures comprising the organic lines 124 disposed parallel to one another with the intersection of the organic lines 124 being at other than 90° are contemplated. As such, organic lines 124 forming the reticular structure may be arranged to form parallelograms with "corners" at the embossments 122.

In representative embodiments, embossment 122 may have a substantially circular or substantially polygonal shape. Moreover, the embossment 122 may include a larger amount of organic material per unit area compared to each of the organic lines 124 themselves. For example, when the embossment 122 is circular shape, a diameter of the embossment 122 is larger than a width of the organic lines 124.

In a representative embodiment, the embossment 122 has a diameter in the range of approximately 30 µm to approximately 40 µm, and a thickness (height) of approximately 10 µm to approximately 15 µm. Similarly, the width of the embossment 122 of a shape other than a circle (e.g., a polygon) has a greatest width of approximately 30 µm to approximately 40 µm, and a thickness (height) of approximately 10 µm to approximately 15 µm.

By contrast, when completely structured, the organic lines 124, which comprise organic fiber s described above, have a width of approximately 15 µm to approximately 19 µm, and a thickness (height) of approximately 10 µm to approximately 15 µm.

The organic layer 120 may be formed after making the surface of the copper layer 110 uneven. For example, the surface of the copper layer 110 is oxidized, and then organic matter is applied to the oxidized surface thereof using a known method. For example, imidazole is sprayed using a nozzle to form the organic lines 124, and these organic lines 124 intersect each other to form the organic layer 120 on the surface of the copper layer 110. Each embossment 112 may include a larger amount of imidazole per unit area compared to each organic line 124.

Generally, the entire organic layer is deposited in a single step to ensure better adhesion across the deposition surface (i.e., upwards and downwards over the surface). Notably, the print machine's/nozzle's insertion rate is set to provide a substantially even thickness.

The organic lines 124 can be strongly connected with each other by the embossments 122. As such, the embossments 122 serve to "tighten up" or anchor the grid of organic lines 124, which ultimately improves the robustness of the entire reticular structure comprising the embossments and organic lines.

A part of the copper layer 110 may be exposed by a region of the organic layer 120, in the region of which the embossments 122 and the organic lines 124 are not formed.

The gold layer 130 is disposed over the organic layer 120. The gold layer 130 may be in contact with the copper layer 110 because a part of the copper layer 110 is not covered by the organic layer 120. For example, the gold layer may be in contact with both the copper layer 110 and the organic layer 120. In a representative embodiment, the gold layer 130 has a thickness (height) of approximately 25 µm to approximately 50 µm, and the copper layer 110 has a thickness (height) of approximately 20 µm to approximately 40 µm. The copper layer 110 and the gold layer 130 are deposited using a known method suitable for use with the formation of other layers and structures of the representative embodiments.

The gold layer 130 is attached to the copper layer 110 by the organic layer 120. Further, the organic layer 120 can prevent copper from being diffused from the copper layer 110 to the gold layer 130. In this case, a bonding pad, in which the gold layer 130 is laminated on the copper layer 110 without nickel, can be formed, thus reducing a production cost and simplifying a process.

Figure 4:
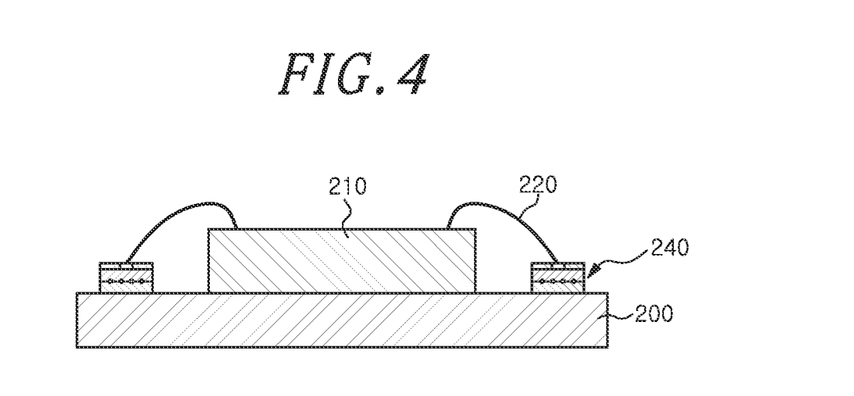
FIG. 4 is a sectional view showing an example in which a printed circuit board is wire-bonded with a semiconductor chip using the bonding pad in accordance with a representative embodiment.
Figure 5:
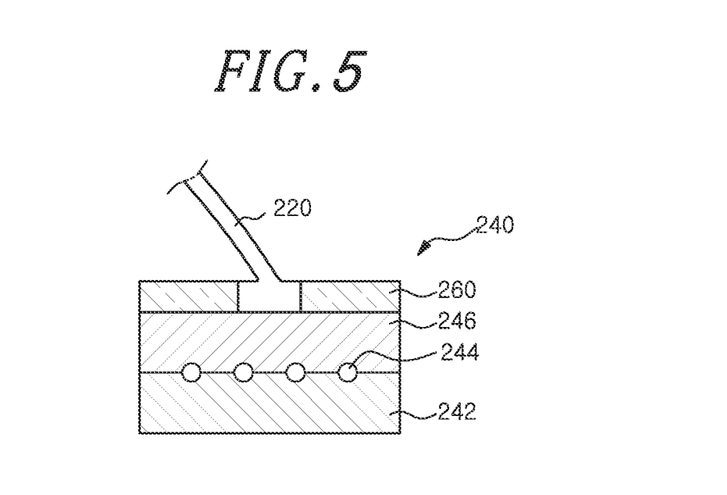
FIG. 5 is an enlarged view of the bonded part of the bonding pad of FIG. 4 and a wire.

FIG. 4 is a cross-sectional view showing an example in which a printed circuit board is wire-bonded with a semiconductor chip using the bonding pad according to a representative embodiment. FIG. 5 is an enlarged view of the bonded part of the bonding pad of FIG. 4 and a wire. Many of the aspects of the bonding pads described in connection with the representative embodiments of FIGS. 4 and 5 are substantially identical as the corresponding elements discussed above with reference to the bonding pad 100. Generally, the details of these substantially identical elements are not repeated in the description of representative embodiments of FIGS. 4 and 5 in order to avoid obscuring its description.

Referring to FIG. 4, a semiconductor chip 210 is disposed over a printed circuit board 200. Circuitry (not shown) is disposed over an upper or a lower surface of the printed circuit board 200. A bonding pad 240 in accordance with a representative embodiment is formed over the printed circuit board 200, and is electrically connected with the circuitry. The semiconductor chip 210 is connected to the bonding pad 240 by a wire 220.

Referring to FIG. 5, bonding pad 240, comprising an organic layer 244 disposed between a copper layer 242 and a gold layer 246, is depicted in greater detail. Since the structures and functions of the copper layer 242, the organic layer 244 and the gold layer 246 are substantially the same as those explained with reference to FIG. 3, detailed descriptions thereof are omitted presently.

The wire 220 is attached to the gold layer 246. The wire 220 may include a conductive material, such as copper, gold, titanium, tin or an alloy or other combination thereof. An anti-oxidation film 260 is formed over the gold layer 246. The anti-oxidation film 260 is not disposed over a portion of the gold layer 246, on the portion of which the wire 220 is attached to the gold layer 246. For example, the anti-oxidation film 260 may include polyethylene. The anti-oxidation film 260 serves to prevent the oxidation of the gold layer 246.

Figure 6:
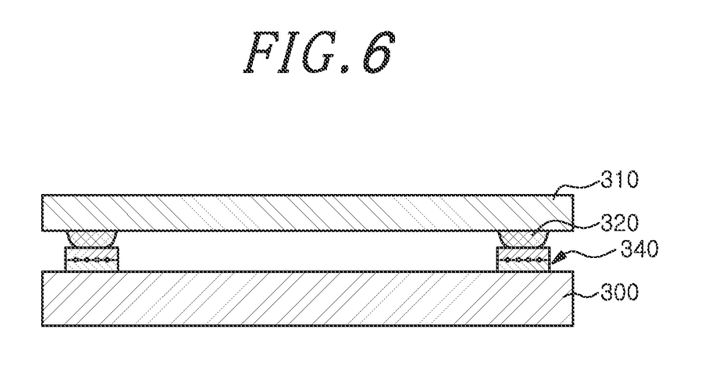
FIG. 6 is a cross-sectional view showing a printed circuit board which is flip-chip-bonded to a semiconductor chip using the bonding pad in accordance a representative embodiment.
Figure 7:
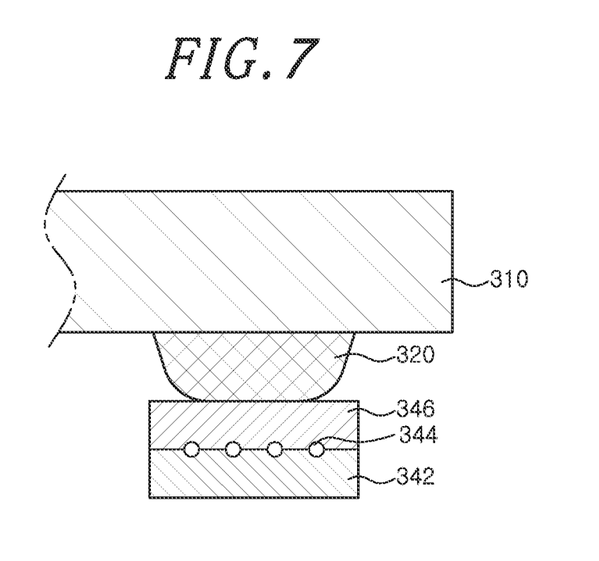
FIG. 7 is an enlarged view of the flip-chip-bonded part of FIG. 6.

FIG. 6 is a cross-sectional view showing an example in which a printed circuit board is flip-chip-bonded with a semiconductor chip using the bonding pad according to a representative embodiment. FIG. 7 is an enlarged view of the flip-chip-bonded part of FIG. 6. Again, many of the aspects of the bonding pads described in connection with the representative embodiments of FIGS. 6 and 7 are substantially identical as the corresponding elements discussed above with reference to the bonding pads described in connection with representative embodiments of FIGS. 4 and 5. Generally, the details of these substantially identical elements are not repeated in the description of representative embodiments of FIGS. 6 and 7 in order to avoid obscuring its description.

Referring to FIG. 6, a semiconductor chip 310 is disposed over a printed circuit board 300. Circuitry (not shown) is disposed over an upper or a lower surface of the printed circuit board 300. A bonding pad 340 in accordance with a representative embodiment is formed over the printed circuit board 300, and is electrically connected with the wiring. The semiconductor chip 310 is connected to the bonding pad 340 by a bump 320.

Referring to FIG. 7, bonding pad 340, comprising an organic layer 344 disposed between a copper layer 342 and a gold layer 346, is depicted in greater detail. Since the structures and functions of the copper layer 342, the organic layer 344 and the gold layer 346 are substantially the same as those explained with reference to FIG. 3, detailed descriptions thereof are omitted. The bump 320 is attached to the gold layer 346. The bump 320 may include a conductive material, such as copper, gold, titanium, tin or an alloy or other combination thereof.

Figure 8:
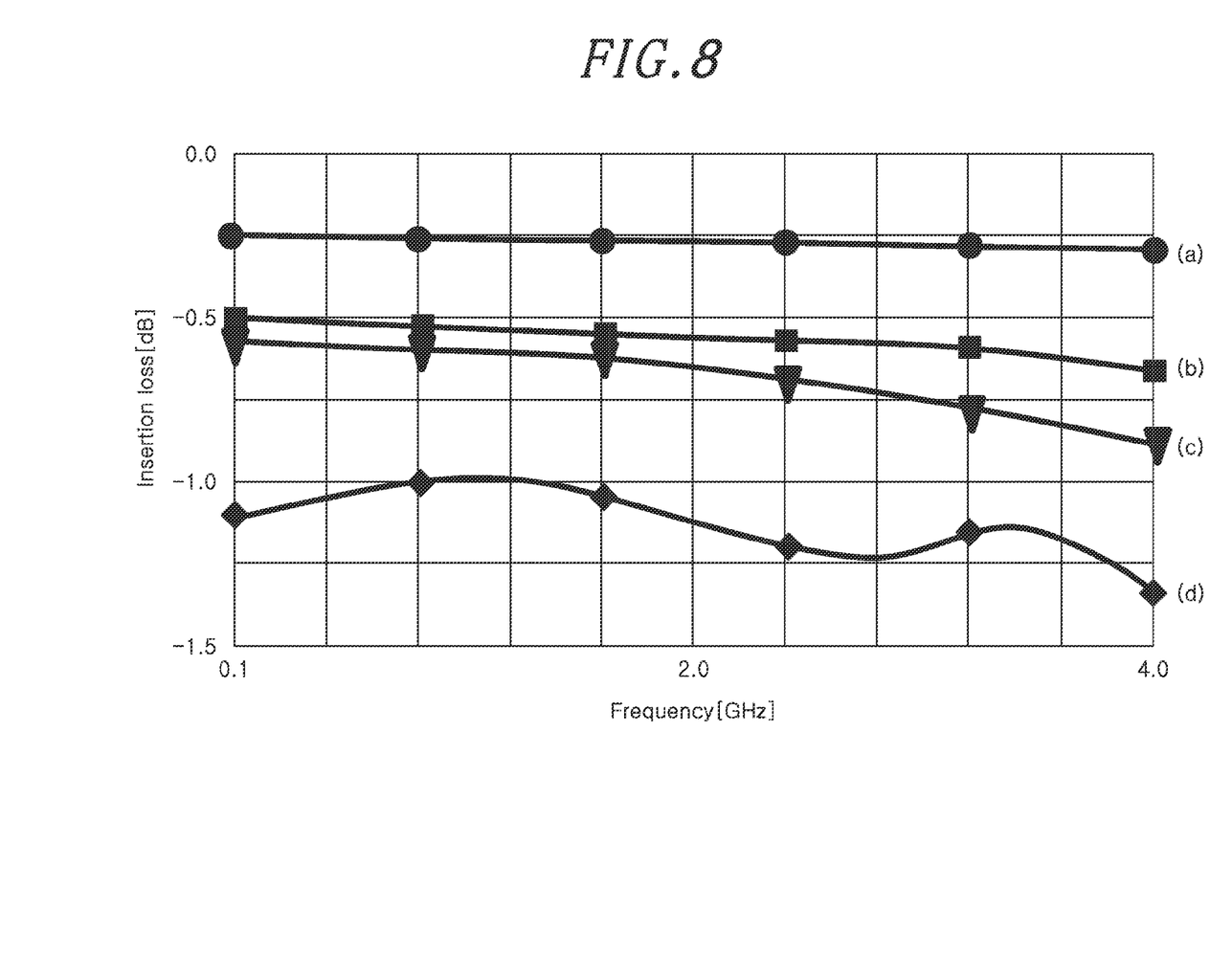
FIG. 8 is a graph showing the results of testing the bonding pads in accordance with the present invention and a bonding pad including a diffusion barrier film that uses nickel.

FIG. 8 is a graph showing the results of testing the bonding pads according to representative embodiment and a known bonding pad including a diffusion barrier film that includes nickel. FIG. 8 is a graph showing the insertion losses of the bonding pads in a frequency band of 100 MHz to 4.0 GHz. Here, (a) of FIG. 8 shows the insertion loss of the bonding pad with respect to frequency in the case of an "ideal" connection. Further, (b) of FIG. 8 shows the insertion loss of the bonding pad with respect to frequency in the case where the printed circuit board is flip-chip-bonded with the semiconductor chip using the bonding pad according to a representative embodiment; (c) of FIG. 8 shows the insertion loss or the bonding pad with respect to frequency in the case where the printed circuit board is wire-bonded with the semiconductor chip using the bonding pad according to another representative embodiment; and (d) of FIG. 8 shows the insertion loss of the bonding pad with respect to frequency in the case where the printed circuit board is wire-bonded with the semiconductor chip using a known bonding pad formed of a copper layer, a nickel layer and a gold layer.

Referring to FIG. 8, it can be ascertained that a small insertion loss of −0.25 dB to −0.275 Db, which was hardly changed, was observed in the case ((a) of FIG. 8) of ideal connection. Further, it can be ascertained that an insertion loss of −0.5 dB to −0.8 dB was observed in the case ((b) of FIG. 8) where the printed circuit board was flip-chip-bonded with the semiconductor chip using the bonding pad according to a representative embodiment and in the case ((c) of FIG. 8) where the printed circuit board was wire-bonded with the semiconductor chip using the bonding pad according to another representative, where the insertion loss is smaller than that observed in the case ((d) of FIG. 8) where a known bonding pad formed of a copper layer, a nickel layer, and a gold layer was used.

Figure 9:
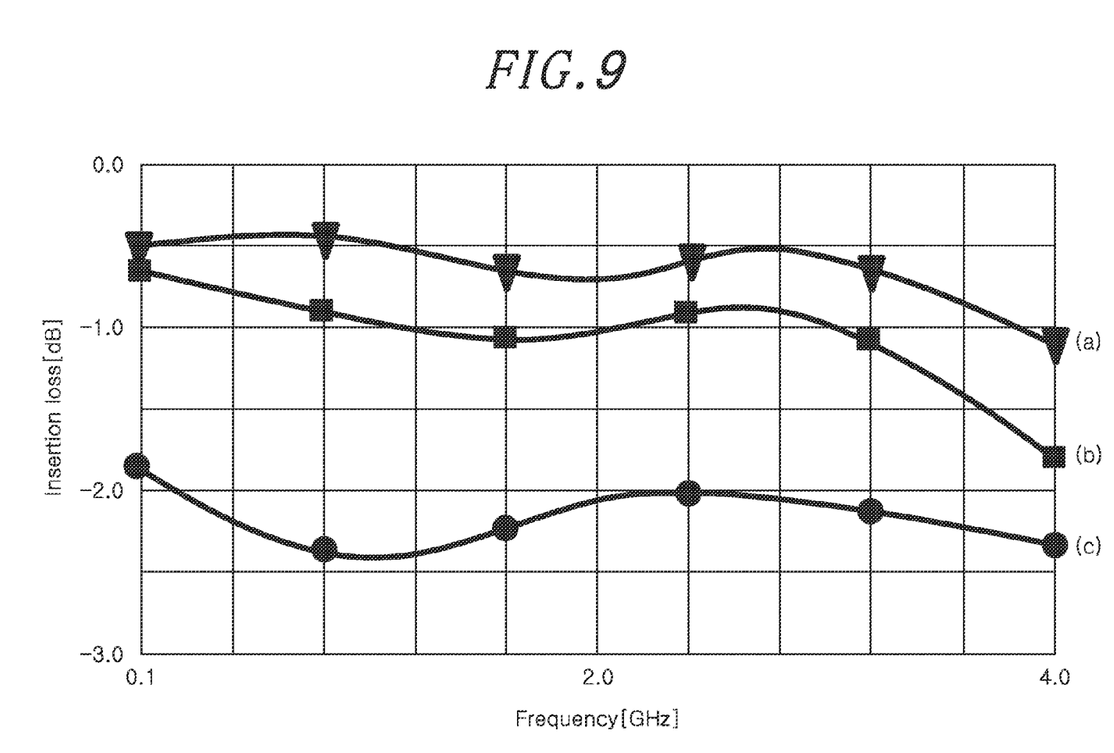
FIG. 9 is a graph showing the results of testing a duplexer die flip-chip-bonded using the bonding pad in accordance with a representative embodiment.
Figure 10:
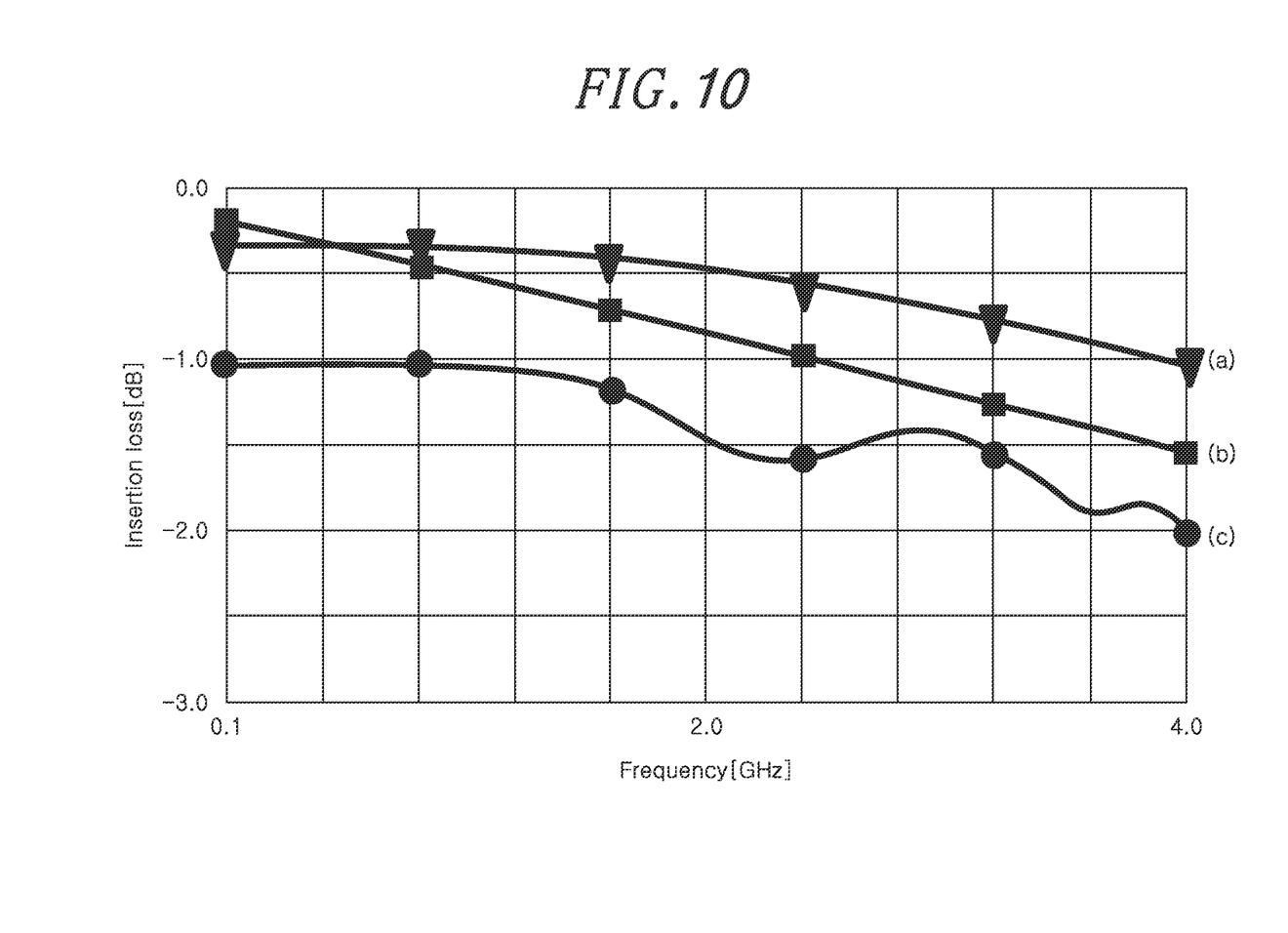
FIG. 10 is a graph showing the results of testing a switch die wire-bonded using the bonding pad in accordance with a representative embodiment.

FIG. 9 is a graph showing the results of testing a duplexer die flip-chip-bonded using the bonding pad according to a representative embodiment. FIG. 10 is a graph showing the results of testing a switch die wire-bonded using the bonding pad according to a representative embodiment.

Referring to FIGS. 9 and 10, it can be ascertained that the insertion loss of the bonding pad is small in the case ((a) of FIG. 9) where the duplexer die was flip-chip-bonded using the bonding pad according to a representative embodiment and in the case ((a) of FIG. 10) where the switch die was wire-bonded using the bonding pad according to another representative embodiment.

As described above, the bonding pads according to representative embodiments are beneficial at least because copper in the copper layer is substantially prevented from being diffused into the gold layer.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention. Accordingly, any and all modifications, variations, or equivalent arrangements should be considered to be within the scope of the invention, and the detailed scope of the invention will be disclosed by the accompanying claims.

What is claimed is:

1. A bonding pad, comprising:
   a multilayer structure comprising:
   a copper layer;
   an organic layer disposed over the copper layer, the organic layer disposed in a pattern such that part of the copper layer is exposed, the pattern comprising a plurality of lines that intersect one another, and an embossment at each point that the plurality of lines of the organic layer intersect each other; and
   a gold layer disposed over the organic layer and in contact with the exposed part of the copper layer.

2. The bonding pad of claim 1, wherein the organic layer comprises imidazole.

3. The bonding pad of claim 1, wherein the embossment comprises a greater amount of the organic layer per unit area than the plurality of lines of the organic layer.

4. The bonding pad of claim 1, wherein the embossment has a substantially circular shape.

5. The bonding pad of claim 1, wherein the embossment has a substantially polygonal shape.

6. A semiconductor chip package, comprising:
   a printed circuit board;
   a bonding pad comprising: a multilayer structure disposed over the printed circuit board, the multilayer structure comprising: an organic layer disposed over the copper layer in a pattern such that part of a copper layer is exposed, the pattern comprising a plurality of lines that intersect one another, and an embossment at each point that the plurality of lines of the organic layer intersect each other; and a gold layer disposed over the organic layer and in contact with the exposed part of the copper layer; and
   a semiconductor chip attached to the bonding pad.

7. The semiconductor chip package of claim 6, wherein the bonding pad is attached to the semiconductor chip by a wire.

8. The semiconductor chip package of claim 6, wherein the bonding pad is attached to the semiconductor chip by flip chip bonding.

9. The bonding pad of claim 6, wherein the organic layer comprises imidazole.

10. The bonding pad of claim 6, wherein the embossment comprises a greater amount of the organic layer per unit area than the plurality of lines of the organic layer.

11. The bonding pad of claim 6, wherein the embossment has a substantially circular shape.

12. The bonding pad of claim 6, wherein the embossment has a substantially polygonal shape.

13. A bonding pad, comprising:
   a multilayer structure comprising: a copper layer;
   an organic layer disposed over the copper layer and having a reticular structure comprising a plurality of lines such that part of the copper layer is exposed, the plurality of lines of the organic layer intersecting each other; and
   a gold layer disposed over the organic layer and in contact with the exposed part of the copper layer.

14. The bonding pad of claim 13, wherein each of the plurality of lines of the organic layer intersect another at an angle of approximately 90°.

15. The bonding pad of claim 13, wherein each of the plurality of lines of the organic layer intersect another at an angle other than approximately 90°.

16. The bonding pad of claim 13, further comprising an embossment at each point that the plurality of lines of the organic layer intersect each other.

17. The bonding pad of claim 13, wherein the organic layer comprises imidazole.

18. The bonding pad of claim 13, further comprising an embossment at each point that the plurality of lines of the organic layer intersect each other.

19. The bonding pad of claim 18, wherein the embossment comprises a greater amount of the organic layer per unit area than the plurality of lines of the organic layer.

20. The bonding pad of claim 18, wherein the embossment has a substantially circular shape.

21. The bonding pad of claim 18, wherein the embossment has a substantially polygonal shape.

22. A semiconductor chip package, comprising:
   a printed circuit board;
   a bonding pad comprising: a multilayer structure disposed over the printed circuit board, the multilayer structure comprising: an organic layer disposed over the copper layer having a reticular structure comprising a plurality of lines such that part of the copper layer is exposed; and
   a gold layer disposed over the organic layer and in contact with the exposed part of the copper layer; and
   a semiconductor chip attached to the bonding pad.

23. The semiconductor chip package of claim 22, wherein each of the plurality of lines of the organic layer intersect another at an angle of approximately 90°.

24. The semiconductor chip package of claim 22, wherein each of the plurality of lines of the organic layer intersect another at an angle other than approximately 90°.

25. The semiconductor chip package of claim 22, further comprising an embossment at each point that the plurality of lines of the organic layer intersect each other.

26. The semiconductor chip package of claim 22, wherein the organic layer comprises imidazole.

27. The semiconductor chip package of claim 22, further comprising an embossment at each point that the plurality of lines of the organic layer intersect each other.

28. The semiconductor chip package of claim 27, wherein the embossment comprises a greater amount of the organic layer per unit area than the plurality of lines of the organic layer.

29. The semiconductor chip package of claim 27, wherein the embossment has a substantially circular shape.

30. The semiconductor chip package of claim 27, wherein the embossment has a substantially polygonal shape.

31. The semiconductor chip package of claim 22, wherein the bonding pad is attached to the semiconductor chip by a wire.

32. The semiconductor chip package of claim 22, wherein the bonding pad is attached to the semiconductor chip by flip chip bonding.

* * * * *